United States Patent
Hanawa et al.

(10) Patent No.: US 10,636,621 B2
(45) Date of Patent: Apr. 28, 2020

(54) CHARGED PARTICLE BEAM DEVICE FOR MOVING AN APERTURE HAVING PLURALITY OF OPENINGS AND SAMPLE OBSERVATION METHOD

(71) Applicant: Hitachi High-Technologies Corporation, Minato-ku, Tokyo (JP)

(72) Inventors: Akinari Hanawa, Tokyo (JP); Hideki Kikuchi, Tokyo (JP); Yoshifumi Taniguchi, Tokyo (JP); Toshie Yaguchi, Tokyo (JP); Takashi Dobashi, Tokyo (JP); Keitaro Watanabe, Tokyo (JP); Hirokazu Tamaki, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 33 days.

(21) Appl. No.: 15/560,286

(22) PCT Filed: Apr. 14, 2015

(86) PCT No.: PCT/JP2015/061407
§ 371 (c)(1),
(2) Date: Sep. 21, 2017

(87) PCT Pub. No.: WO2016/166805
PCT Pub. Date: Oct. 20, 2016

(65) Prior Publication Data
US 2018/0076004 A1    Mar. 15, 2018

(51) Int. Cl.
*H01J 37/22*    (2006.01)
*H01J 37/26*    (2006.01)
(Continued)

(52) U.S. Cl.
CPC ............ *H01J 37/224* (2013.01); *H01J 37/09* (2013.01); *H01J 37/26* (2013.01); *H01J 37/265* (2013.01);
(Continued)

(58) Field of Classification Search
None
See application file for complete search history.

(56) References Cited

U.S. PATENT DOCUMENTS 5,304,801 A * 4/1994 Arai ...................... H01J 37/295
                                                                 250/311
5,502,306 A * 3/1996 Meisburger .......... G01R 31/307
                                                                 250/307
(Continued)

FOREIGN PATENT DOCUMENTS

| JP | 4-366539 A | 12/1992 |
| JP | 2007-122998 A | 5/2007 |
| JP | 2009-110788 A | 5/2009 |

OTHER PUBLICATIONS

International Search Report (PCT/ISA/210) issued in PCT Application No. PCT/JP2015/061407 dated May 19, 2015 with English translation (Two (2) pages).

Japanese-language Written Opinion (PCT/ISA/237) issued in PCT Application No. PCT/JP2015/061407 dated May 19, 2015 (Four (4) pages).

*Primary Examiner* — James Choi
(74) *Attorney, Agent, or Firm* — Crowell & Moring LLP (57) ABSTRACT

A charged particle beam device wherein a transmission image corresponding to an arbitrary diffraction spot or a diffraction pattern corresponding to a partial range in the transmission image are easily and automatically captured. A charged particle beam device having: an image-capturing unit for forming an image of a sample; a diaphragm disposed in the image-capturing unit, a plurality of openings having different sizes for transmitting an electron beam from the sample being formed in the diaphragm; a movement unit for
(Continued)

varying the position of the diaphragm; and a display unit for displaying the formed image, wherein when the operator selects, e.g., a diffraction spot (A) on the display unit, the movement unit moves the diaphragm from the positional relationship between the diaphragm and the image in accordance with the position of the diffraction spot (A).

4 Claims, 11 Drawing Sheets

(51) Int. Cl.
  *H01J 37/295* (2006.01)
  *H01J 37/09* (2006.01)
(52) U.S. Cl.
  CPC ..... *H01J 37/295* (2013.01); *H01J 2237/0455* (2013.01)

(56) References Cited

U.S. PATENT DOCUMENTS

| | | | | |
|---|---|---|---|---|
| 6,545,274 | B1* | 4/2003 | Morita | B82Y 10/00 250/397 |
| 2005/0045821 | A1* | 3/2005 | Noji | G01N 23/225 250/311 |
| 2007/0158568 | A1* | 7/2007 | Nakamura | H01J 37/153 250/311 |
| 2009/0045337 | A1* | 2/2009 | Kimura | H01J 37/09 250/310 |
| 2012/0057015 | A1* | 3/2012 | Ward | H01J 37/265 348/80 |
| 2013/0299696 | A1* | 11/2013 | Yamazaki | H01J 37/26 250/307 |
| 2014/0226003 | A1* | 8/2014 | Phaneuf | H01J 37/222 348/80 |

* cited by examiner

CHARGED PARTICLE BEAM DEVICE FOR MOVING AN APERTURE HAVING PLURALITY OF OPENINGS AND SAMPLE OBSERVATION METHOD

TECHNICAL FIELD

The present invention relates to a charged particle beam device and a sample observation method using the device.

BACKGROUND ART

In recent years, advanced operation techniques such as the adjustment of an aperture position have been required to acquire any dark-field image. On the other hand, these operation techniques have been a cause of making it difficult to acquire a dark-field image.

CITATION LIST

Patent Literature

PTL1: JP-A-2009-110788

SUMMARY OF INVENTION

Technical Problem

Hereinafter, a description will be given of a procedure of the related art which is used to acquire a dark-field image by using a transmission electron microscope (hereinafter, referred to as a "TEM"). An operator operates a projective lens after an observation region is determined, and switches an observation mode to a diffraction pattern observation mode. Next, an objective aperture is introduced on a light path so as to be positioned, and an image of an electron beam component in only a desired diffraction spot region is formed on an imaging surface. Thereafter, the projective lens is operated so as to switch the observation mode to a TEM image observation mode, thereby capturing a dark-field image corresponding to a predetermined diffraction spot. In order to capture a dark-field image corresponding to another diffraction spot, the observation mode is switched to the diffraction pattern observation mode again, and the same operation is repeated. In this manner, in the related art, in order to capture a dark-field image by using a TEM, a plurality of adjustment operations such as the operator's operation of switching between a diffraction pattern observation mode and a TEM image observation mode and the operator's manual operation of adjusting the position of an objective aperture have been required. In addition, the operation of adjusting the position of the objective aperture is required to be performed by a manual input of a coordinate point, which takes much time and labor.

Consequently, an object of the invention is to provide a charged particle beam device that does not require an operator's operation of switching between a diffraction pattern observation mode and a TEM image observation mode and the operator's operation of adjusting the position of an objective aperture, and has a function of easily and automatically capturing a transmission image corresponding to any diffraction spot and capturing an image of a diffraction pattern corresponding to a partial range of the transmission image easily in a short period of time.

Solution to Problem

In order to accomplish the above-described object, the invention adopts configurations described in the scope of claims. That is, the invention adopts a configuration in which a display unit displaying an image and a selection unit selecting the position of a predetermined portion from the displayed image are provided, and a predetermined opening is selected from a positional relationship between an aperture and the image in accordance with the selected position of the predetermined portion.

More specifically, the invention provides a charged particle beam device including an condenser unit which irradiates a sample with a charged particle beam, an projective unit which forms an image of the sample, an aperture which is disposed inside the projective unit and in which a plurality of openings, having different sizes, for transmitting an electron beam from the sample are formed, a movement unit which changes a position of the aperture, a detection unit which obtains an image formed by the projective optical system, a display unit which displays the image obtained by the detection unit, and a selection unit which selects a predetermined portion from the displayed image, in which the movement unit moves the aperture from a positional relationship between the aperture and the image in accordance with a position of the selected predetermined portion, in which the image is at least one of an electron beam diffraction image and a transmission image of the sample, and in which the aperture is at least one of an objective aperture capable of being inserted into a diffraction surface within the projective unit and a selected area aperture capable of being inserted into a primary image surface within the projective unit.

Advantageous Effects of Invention

According to the invention, an operator selects, for example, a predetermined portion (for example, a spot) of a diffraction image on a display unit, and thus it is possible to easily and automatically acquire a transmission image corresponding to the selected portion. In addition, according to the invention, the operator selects, for example, a predetermined portion (for example, a range) of the transmission image on the display unit, and thus it is possible to easily and automatically acquire a diffraction image corresponding to the selected portion. Problems, configuration, and effects other than those described above become apparent by the following description of embodiments.

DESCRIPTION OF EMBODIMENTS

Hereinafter, an example of the invention will be described with reference to the accompanying drawings. Meanwhile, the example of the invention is not limited to an example to be described later, and various modifications can be made within the scope of the technical idea thereof.

[Basic Configuration]
[Configuration of Device]

Figure 1:
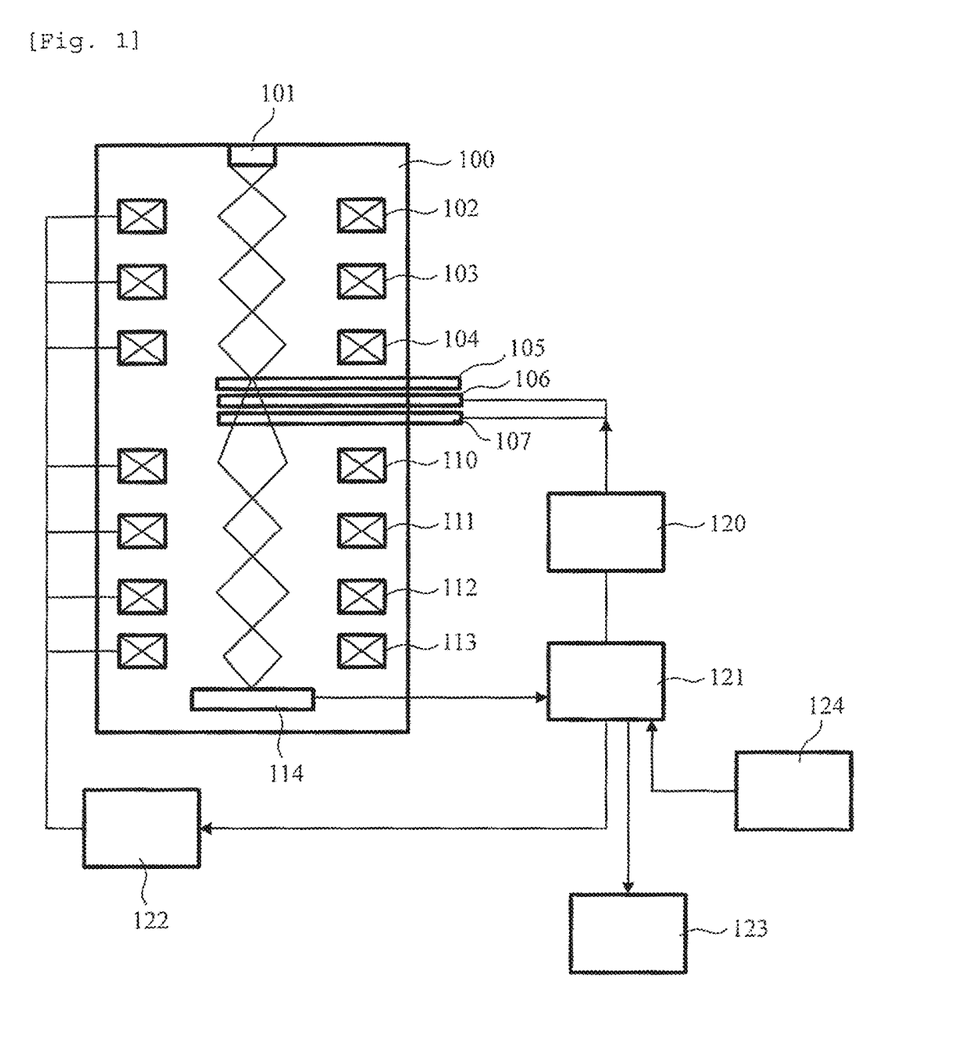
FIG. 1 is a diagram illustrating the entire configuration of a transmission electron microscope (TEM) according to an example.

FIG. 1 illustrates an example of a schematic configuration of a transmission electron microscope (TEM) which is one of charged particle beam devices. An electron beam generated by an electron gun 101 is collected by condenser lenses 1 to 3 (102 to 104), and is emitted to a sample (not shown) mounted on a sample stage 105. Electrons having passed through the sample are guided to an imaging surface of a CCD camera 114 through projective lenses 1 to 4 (110 to 113). An electronic image detected by the CCD camera 114 is imaged after being taken in a main control device 121. An operator observes the image as a sample image. The condenser lenses 1 to 3 (102 to 104), the sample stage 105, an objective aperture 106, and a selected area aperture 107 are controlled by an aperture control substrate 120 that receives an instruction from the main control device 121. The image imaged by the main control device 121 is displayed on a display device 123. Meanwhile, an input device 124 is used to designate a partial region of the image displayed on the display device 123. A pointing device 180 to be described later is an example of the input device 124. The inside of a main column 100 is evacuated up to approximately 10-5 Pa by an evacuation pump not shown in the drawing.

The sample used for observation is made thin up to several tens of nm by a focused ion beam device or the like, and is mounted on a sample stand. The sample stand is installed in a sample holder, and is introduced into the main column 100 through a preliminary exhaust chamber (airlock chamber) embedded in a sample movement device not shown in the drawing.

[TEM Image]

An orbit of an electron beam during the observation of a TEM image (transmission image) will be described with reference to FIG. 2. A sample 131 is irradiated with substantially parallel beams 130 by condenser lenses 102 to 104 (not shown in FIG. 2) during the observation of the TEM image, and electrons interacting with the sample 131 are enlarged by a plurality of stages of projective lenses 132 and 133 installed below the sample. The enlarged image is formed on the CCD camera 114 to be imaged. FIG. 3 is an example of a TEM image (transmission image) which is captured using the CCD camera 114.

[Diffraction Pattern]

Figure 2:
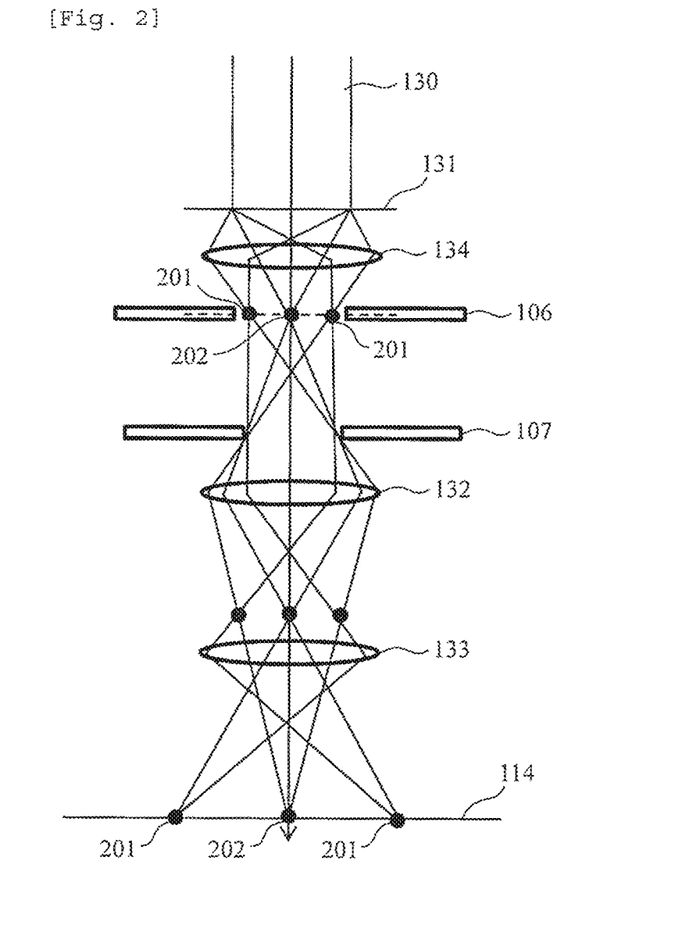
FIG. 2 is a diagram illustrating an orbit of an electron beam.
Figure 3:
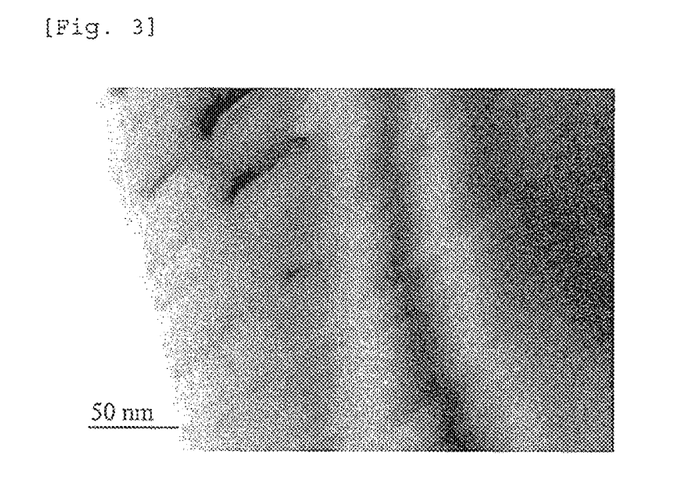
FIG. 3 is a diagram illustrating an example of a TEM image captured using a transmission electron microscope (TEM).
Figure 4:
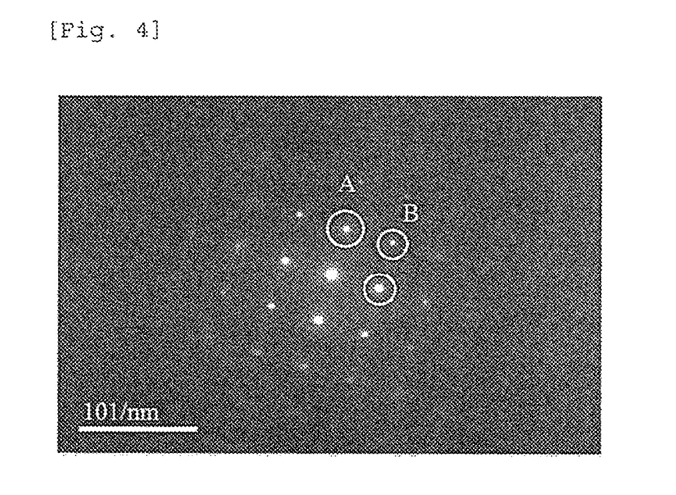
FIG. 4 is a diagram illustrating an example of a diffraction pattern imaged using a transmission electron microscope (TEM).

In a case where a diffraction pattern is observed, a diffraction spot 201 and a transmission spot 202, which are formed below a sample, are enlarged using a plurality of stages of projective lenses 132 and 133, as illustrated in FIG. 2. The enlarged diffraction spot 201 and transmission spot 202 are formed on the CCD camera 114 to be imaged. In a case where the diffraction pattern is observed, the value of a current flowing to the projective lenses 132 and 133 is different from the value of a current flowing to the projective lenses 132 and 133 in a case where a TEM image is observed. Switching of the current value is executed by the main control unit 121. FIG. 4 is an example of a diffraction pattern corresponding to a TEM image. A diffraction pattern (diffraction spot 201, transmission spot 202) based on a crystal orientation of the sample is observed on an image captured by the CCD camera 114.

[Objective Aperture]

As illustrated in FIG. 2, the objective aperture 106 is installed in the vicinity of a region in which the diffraction spot 201 is formed. The objective aperture 106 is used to cut scattered electrons that are unnecessary during the observation of a TEM image (transmission image) or to capture an image (dark-field image) obtained by forming only a specific diffraction spot 201.

Figure 5:
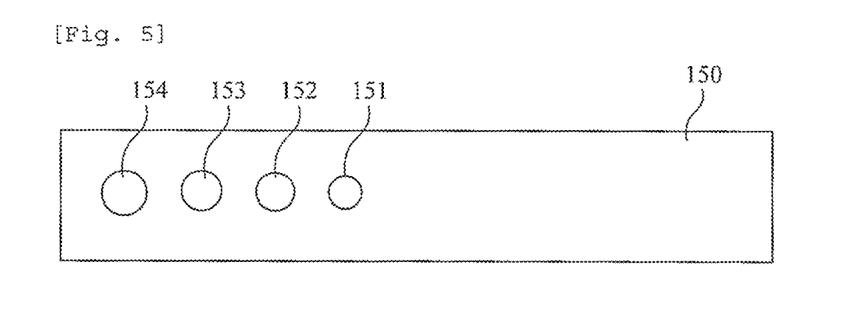
FIG. 5 is a diagram illustrating an example of the structure of an aperture plate.

Next, an example of an objective aperture driving mechanism will be described. An aperture plate 150 illustrated in FIG. 5 is installed at the tip portion of the objective aperture driving mechanism. In a case of FIG. 5, a plurality of holes 151 to 154 having different diameters within a diameter range of several μm to several hundreds of μm are provided. Further, it is also possible to use the aperture plate 150 including a mechanism capable of changing the diameters of the holes. The objective aperture driving mechanism two-dimensionally moves the aperture plate 150 within a plane perpendicular to the optical axis of an electron beam. During the driving of the aperture plate 150, a DC motor, a stepping motor, or the like, not shown in the drawing, which is connected to the aperture control substrate 120 is appropriately selected.

EXAMPLE

Hereinafter, an operation (example 1) in a case of the capturing of a TEM image (transmission image) using a transmission electron microscope and operation (example 2) in a case of the capturing of a diffraction pattern (diffraction image) will be separately described. However, operations to be described later can also be applied to a case where a TEM image (transmission image) or a diffraction pattern (diffraction image) are captured using various charged particle beam devices including an ion microscope.

Example 1

Figure 7:
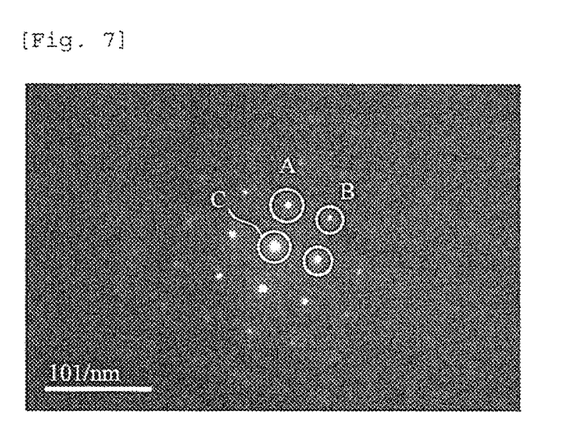
FIG. 7 is a diagram illustrating an example of a diffraction pattern.

In this example, a description will be given of an observation mode in which a dark-field image corresponding to any diffraction spot constituting a diffraction pattern is automatically acquired. In the observation in this example, a diffraction pattern and a transmission image are used. A diffraction pattern illustrated in FIG. 7 includes a transmission wave and diffracted waves. A spot C in FIG. 7 is equivalent to the transmission wave, and the other spots are the diffracted waves. An observation image formed using only the diffracted waves is a dark-field image, and an observation image formed using only the transmission wave is a bright-field image. The dark-field image and the bright-field image are collectively referred to as a transmission image. The selection of the observation image is performed according to which diffraction spot is selected to be transmitted by the objective aperture 106.

Figure 8:
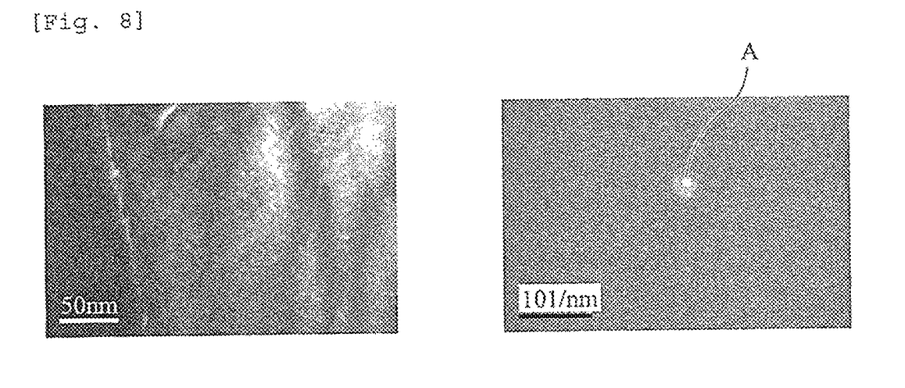
FIG. 8 is a diagram illustrating a dark-field image (left) formed using only a diffraction spot A in the diffraction pattern illustrated in FIG. 7 and a diffraction pattern (right) when only the diffraction spot A is transmitted by an objective aperture.
Figure 9:
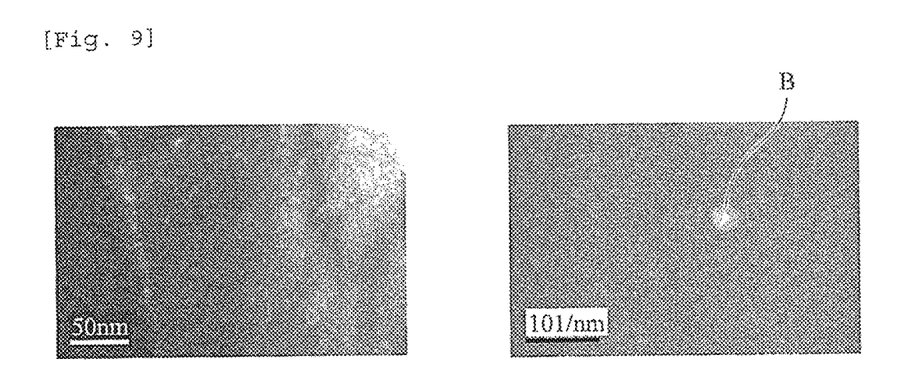
FIG. 9 is a diagram illustrating a dark-field image (left) formed using only a diffraction spot B in the diffraction pattern illustrated in FIG. 7 and a diffraction pattern (right) when only the diffraction spot B is transmitted by an objective aperture.

FIGS. 8 and 9 illustrate dark-field images formed by transmitting only the spot A or only the spot B. In the dark-field images, a strongly diffracted region selected by the objective aperture 106 becomes bright. However, the number of diffraction spots corresponding to the dark-field image is two or more. For this reason, when the dark-field image is observed, it is necessary to select a diffraction spot desired to be observed by an operator from among the plurality of diffraction spots. On the other hand, the number of diffraction spots corresponding to a bright-field image is one. The hole of the objective aperture 106 is positioned so as to transmit only the diffraction spot desired to be observed, and thus it is possible to obtain an observation image based on the desired diffraction spot. However, when the objective aperture 106 is inserted into a light path of an electron beam, the inside of a visual field becomes dark. That is, as illustrated in the right diagram of FIG. 8, a state is set in which only an electron beam having passed through the objective aperture 106 can be observed. As illustrated in FIG. 8, the number of diffraction spots having passed through the objective aperture 106 is one at most. Therefore, it becomes extremely difficult to find any diffraction spot in the observation image.

Figure 10:
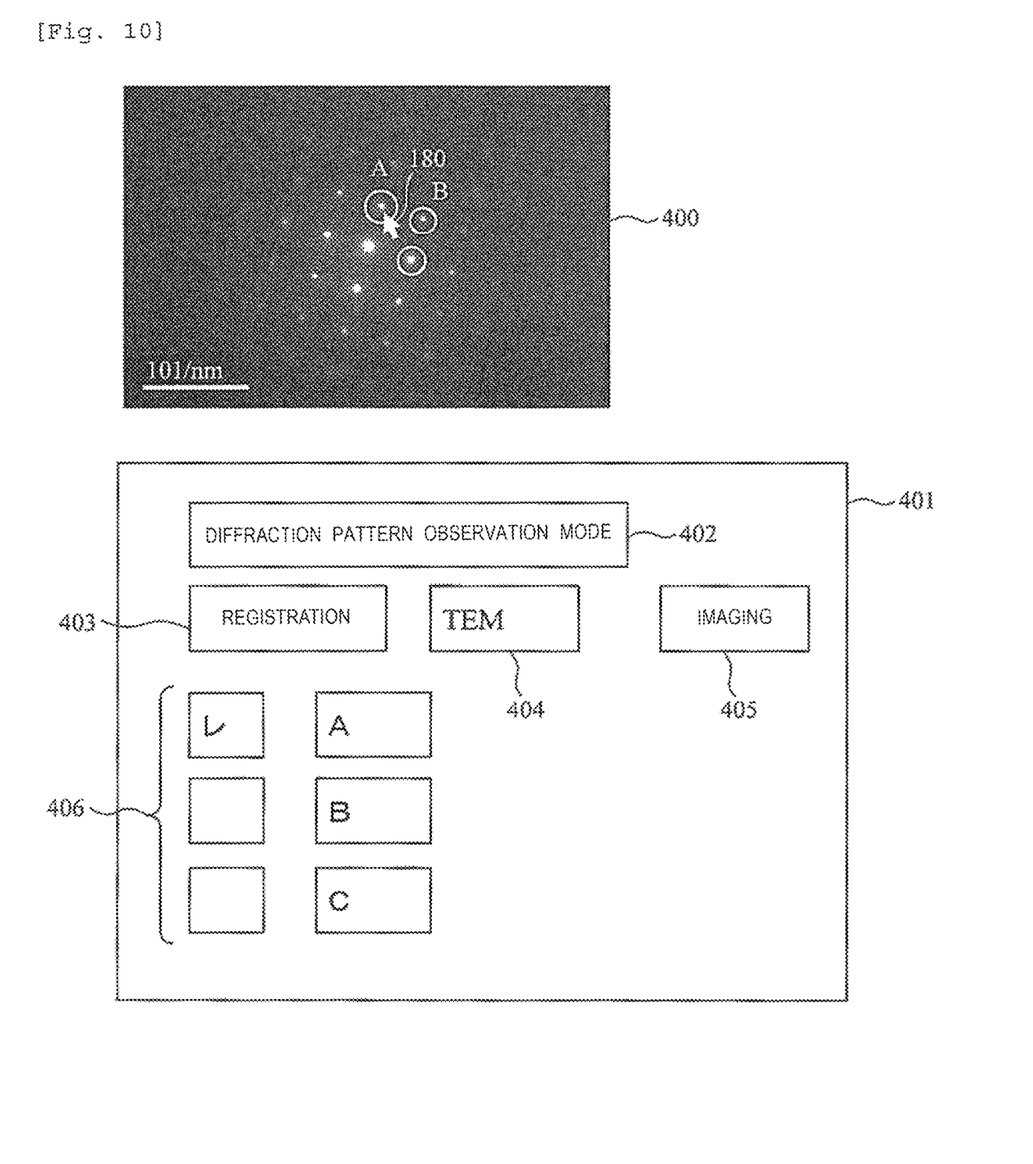
FIG. 10 is a diagram illustrating an example of a GUI used when a dark-field image corresponding to any diffraction spot constituting a diffraction pattern is automatically acquired.
Figure 11:
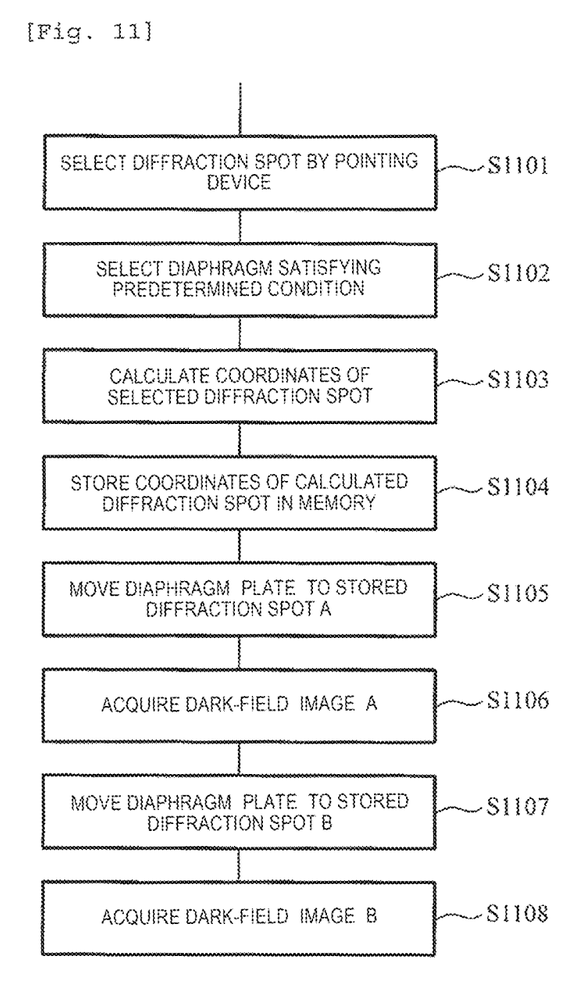
FIG. 11 is a flow chart illustrating a method of automatically acquiring a dark-field image corresponding to any diffraction spot.

Hereinafter, a method of selecting a diffraction spot according to this example will be described. FIG. 10 is an example of a GUI displayed on the display device 123. In FIG. 10, a diffraction pattern is displayed in an image display region 400, and a GUI screen 401 is displayed below the diffraction pattern. Hereinafter, reference will be made to FIGS. 10 and 11 to describe a specific example of a function of automatically and consecutively capturing a dark-field image corresponding to a diffraction spot which is arbitrarily designated.

Step 1101

In a case where a dark-field image corresponding to any spot in a diffraction pattern to be observed is desired to be captured, an operator switches a mode selection column 402 of the GUI screen 401 to a diffraction pattern observation mode. According to this selection, the diffraction pattern is displayed in the image display region 400. The operator selects a diffraction spot at any position where a dark-field image is desired to be captured, on the displayed diffraction pattern.

For example, in a case where a diffraction spot A is selected, the operator inputs a check in an A column of a check box 406 displayed on the GUI screen 401, clicks a registration button 403, and further clicks the spot A in the diffraction pattern. The click operation herein is performed using the pointing device 180 or the like.

Figure 12:
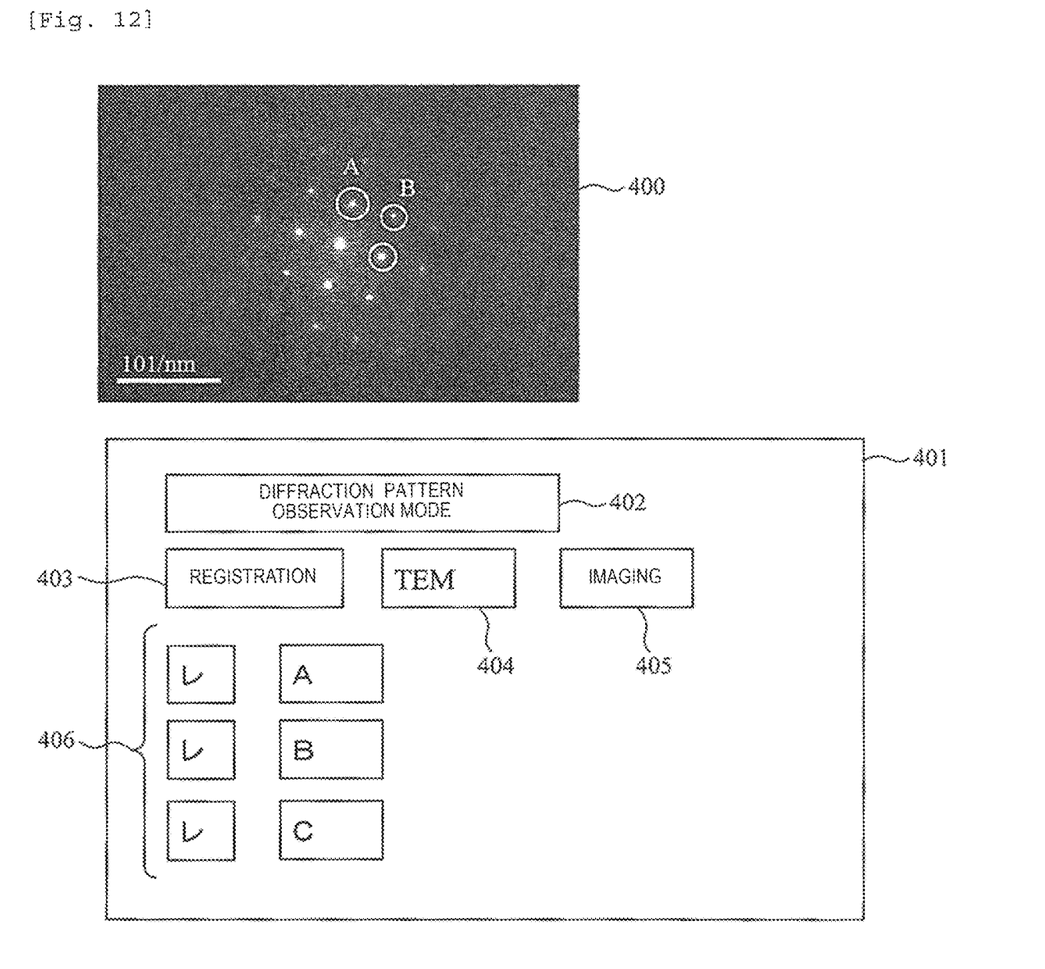
FIG. 12 is a diagram illustrating an example of a GUI used when dark-field images corresponding to a plurality of diffraction spots are automatically acquired.

The number of diffraction spots to be designated is not limited to one, and may be two or more. For example, in a case where a diffraction pattern B is further selected, the operator inputs a check to a B column of the check box 406 displayed on the GUI screen 401 as illustrated in FIG. 12, clicks the registration button 403, and further clicks the spot B in the diffraction pattern. The operator's click operation is repeatedly executed until the registration of a spot desired to be imaged is completed. In FIG. 12, even a spot C is registered.

Step 1102

Whenever a diffraction spot is designated, the main control device 121 selects a hole (any one of the holes 151 to 154 constituting the aperture plate 150) which has an aperture diameter suitable for the observation of individual diffraction spots. The selection of the aperture hole herein includes not only a case where an aperture hole having substantially the same size as the size of the designated any diffraction spot is selected as an optimal diameter, but also a case where a portion of an aperture hole which includes the designated any diffraction spot is selected as an optimal diameter.

Step 1103

The main control device 121 calculates coordinates of all diffraction spots selected on the screen. A diffraction spot to be imaged is uniquely specified on the basis of the coordinates. The coordinates give a position to which an objective aperture is to be moved.

Step 1104

The main control device 121 stores the calculated coordinates of one or a plurality of diffraction spots in a memory not shown in the drawing. That is, the main control device 121 registers the calculated coordinates in the memory. Thereafter, the main control device 121 transitions to an operation mode in which dark-field images of the stored one or plurality of diffraction spots are acquired in order. The acquisition of the dark-field images is started by the operator's click of a TEM button 404 using the pointing device 180.

Step 1105

The main control device 121 having detected the click of the TEM button 404 first automatically moves a specific hole (the hole selected in step 1102) of the objective aperture 106 for the capturing of the dark-field image of the diffraction spot A to the position of coordinates of the diffraction spot A. That is, the position of the objective aperture 106 is adjusted so that the diffraction spot A and the specific hole of the objective aperture 106 conform to each other.

The movement of the objective aperture 106 is controlled in accordance with a positional relationship between the objective aperture 106 and the diffraction pattern. Meanwhile, the center of the objective aperture and the center of an optical axis conform to each other during correction to be described later. A coordinate system of a camera image, a coordinate system of an image formation surface (primary image surface), and a coordinate system of a diffraction surface are similar to each other in accordance with conformity between both the centers, and the coordinate systems can be handled as one coordinate system.

Step 1106

When the operator clicks an imaging button 405, the main control device 121 switches a current value of the projective lens to a TEM image observation mode to acquire a dark-field image A of the diffraction spot A, and displays the acquired image in the image display region 400 of the display device 123. The operator observes the dark-field image A displayed in the image display region 400. In a case where the number of diffraction spots designated is only one, the processing is terminated in the process of this step.

Step 1107

In a case where the plurality of diffraction spots are registered for the capturing of a dark-field image in step 1101, the main control device 121 automatically executes a process of capturing a dark-field image with respect to the other diffraction spots in order. Here, the specific hole (the hole selected in step 1102) of the objective aperture 106 for the capturing of the diffraction spot B is moved to the position of coordinates of the diffraction spot B. That is, the position of the objective aperture 106 is adjusted so that the diffraction spot B and the specific hole of the objective aperture 106 conform to each other. At this time, the main control device 121 may switch the observation mode to a diffraction pattern observation mode, but may maintain the TEM image observation mode because the coordinates of the diffraction spot B are already registered.

Step 1108

When the operator clicks the imaging button 405, the main control device 121 acquires the dark-field image B corresponding to the diffraction spot B, and displays the acquired image in the image display region 400 of the display device 123. The operator observes the dark-field image B displayed in the image display region 400. The processes of steps 1107 and 1108 are repeatedly executed on all of the diffraction spots registered.

In this manner, in this example, a plurality of diffraction spots are registered for one diffraction pattern in advance, and thus it is possible to automatically and consecutively acquire a plurality of dark-field images equivalent to the respective diffraction spots. That is, in the method of this example, it is not necessary to repeat an operation of acquiring a dark-field image by manually designating a coordinate value of one diffraction spot with respect to one diffraction pattern, as in a method of the related art. For this reason, the method in this example can make the acquisition and observation of a dark-field image more remarkably efficient than those in the method of the related art.

Figure 13:
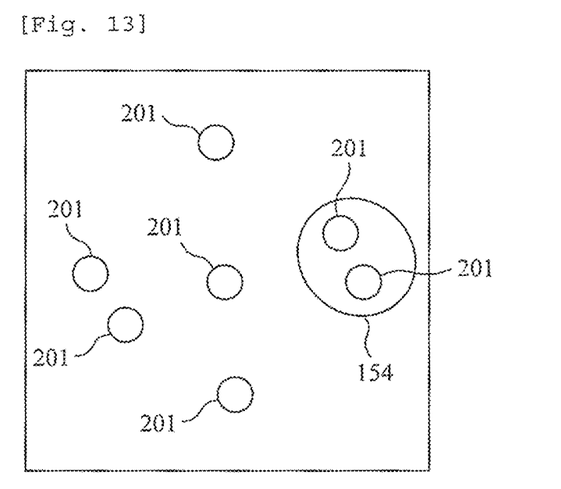
FIG. 13 is a diagram illustrating an example in which a region including a plurality of diffraction spots is selected as an object to be observed.

In the above description, one diffraction spot is selected to acquire one dark-field image, but it is possible to select a plurality of diffraction spots in order to acquire one dark-field image. FIG. 13 illustrates an example of the selection method. In FIG. 13, two adjacent diffraction spots 201 are designated. Incidentally, the hole 154 is used for the observation of a dark-field image corresponding to the two diffraction spots 201. In this case, the dark-field image to be acquired is an image obtained by combining individual dark-field images of the two diffraction spots 201 with each other, and thus it is possible to obtain a dark-field image having a high contrast ratio.

Hereinafter, reference will be made to FIG. 6 to describe an objective aperture driving mechanism capable of automatically moving the objective aperture 106 to the position of coordinates of a diffraction spot registered on the GUI screen 401. The driving mechanism includes an X-axis motor 300 and a Y-axis motor 301 so as to be capable of two-dimensionally moving the objective aperture 106 within a plane perpendicular to the optical axis of an electron beam. In addition, the rotation force of the motor is transmitted to a linear motion of a movable axis 306 by a gear and feed screws 302 to 305. In order to perform high-accuracy control, a real amount of movement in the vicinity of the aperture is measured using an X-axis linear scale 307, and a measurement result is fed back to a motor control unit. Similarly, regarding a Y-axis, linear scales 308 to 309 are mounted. In order to minimize influence due to backlash in the gear or axial deformation, a target distance and a real movement distance in the vicinity of the aperture plate 150 are compared with each other. In the TEM, the inside of the main column 100 into which the aperture plate 150 is inserted is exhausted. For this reason, the linear scales are installed inside the housing 100. Thereby, even in a case where a mechanical deviation such as backlash occurs, it is possible to correctly perform correction. The motor control unit to be considered may be not only the linear scale but also an encoder, a gyro sensor, or the like, but it is preferable that the amount of movement of an axis is measured in order to perform measurement including disturbance.

The correction of coordinates for each aperture is performed by making the center of the aperture and the center of the camera (the center of the optical axis) conform to each other with respect to the insertion of the aperture plate 150. The amount of deviation when selecting an observation region on the GUI is calculated by using the coordinates of an aperture mechanism for the center of the optical axis, thereby allowing movement to any region.

Figure 14:
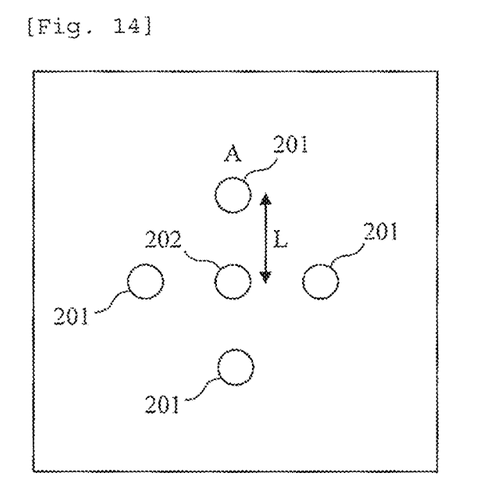
FIG. 14 is a diagram illustrating a method of correcting the number of movement pulses of a aperture from a diffraction pattern.

A correction method will be described with reference to FIG. 14. FIG. 14 illustrates an example of a diffraction pattern formed in the vicinity of the objective aperture 106. The diffraction pattern is formed accompanying a plurality of diffraction spots on a plane perpendicular to a charged particle beam. The diffraction pattern is enlarged using an projective lens, is formed on a scintillator of the CCD camera 114, and is displayed on a screen of the display device 123. The motor included in the objective aperture driving mechanism is driven, and thus it is possible to make only any spot pass through the aperture hole. There is a correlation between one pulse of an encoder included to control the position of the aperture hole and a movement distance of the aperture hole. This correlation can be obtained by measuring a distance on the screen of the display device 123 in a case where the aperture hole is moved by an extent equivalent to a certain number of pulses. For example, when the aperture hole is moved by a distance M on the screen of the display device 123 in a case where the aperture hole is moved by an extent of P pulses, the amount of movement per pulse is obtained by M/P. In this manner, for example, when a distance to the diffraction spot A on the display device 123 is L on the basis of a transmission spot 201 positioned at the center of the diffraction pattern, the number of pulses required to move the aperture hole to the position of the diffraction spot A can be obtained by L×P/M.

As described above, when the transmission electron microscope of this example is used, it is possible to designate one or a plurality of diffraction spots to be observed, among a plurality of diffraction spots constituting one diffraction pattern, at once in the same screen, and to automatically acquire all dark-field images corresponding to the designated diffraction spots. Thereby, it is possible to drastically reduce operational labor and the amount of operation of an operator for observing the dark-field images.

Example 2

In this example, a description will be given of an observation mode in which a diffraction pattern corresponding to a partial region constituting a transmission image is automatically acquired. As illustrated in FIG. 2, a transmission image formed by an objective lens is formed in a region portion below a sample. A selected area aperture 107 is installed in the region portion. The selected area aperture 107 is used to acquire a diffraction pattern of a specific region of a transmission image. An aperture plate constituting the selected area aperture 107 is provided with a plurality of holes having a diameter of 0.1 μm to several hundreds of μm, similar to the aperture plate 150 illustrated in FIG. 5. A current flowing to projective lenses 110 to 113 can be controlled so as to switch between whether to enlarge a diffraction pattern formed directly below a sample to form an image of the diffraction pattern on the CCD camera 114 and whether to enlarge a TEM image formed by an objective lens to form the TEM image on the CCD camera 114.

When the selected area aperture 107 is inserted into the TEM image formed by the objective lens, it is possible to transmit only electrons in a specific region of the TEM image. Further, when an observation mode is switched to a diffraction pattern observation mode by changing a current flowing to the projective lenses 110 to 113, it is possible to observe only a diffraction pattern corresponding to the specific region. It is possible to analyze an atomic structure of the specific region from the diffraction pattern.

Figure 15:
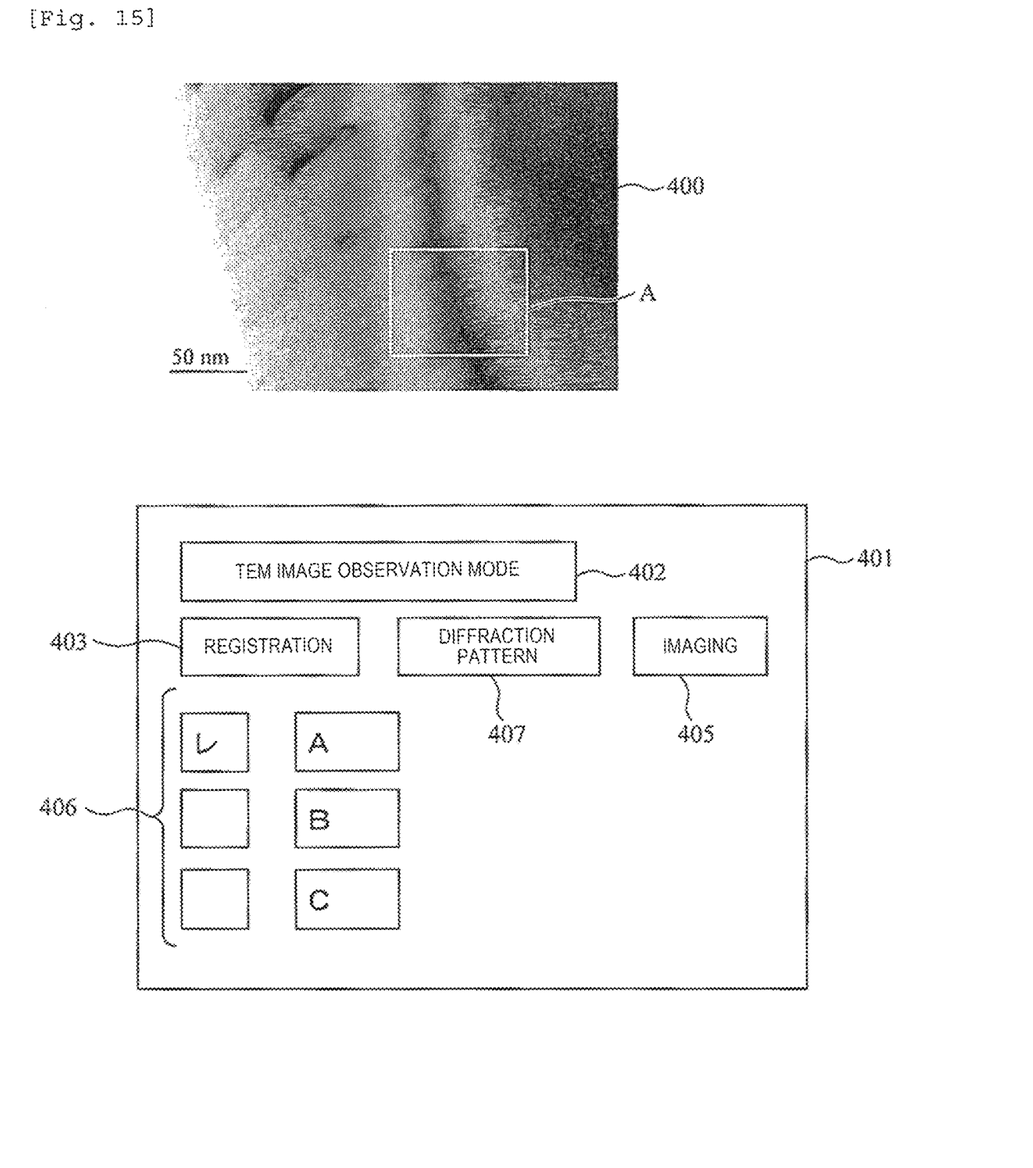
FIG. 15 is a diagram illustrating an example of a GUI used when a diffraction pattern corresponding to any range of a dark-field image is automatically acquired.
Figure 16:
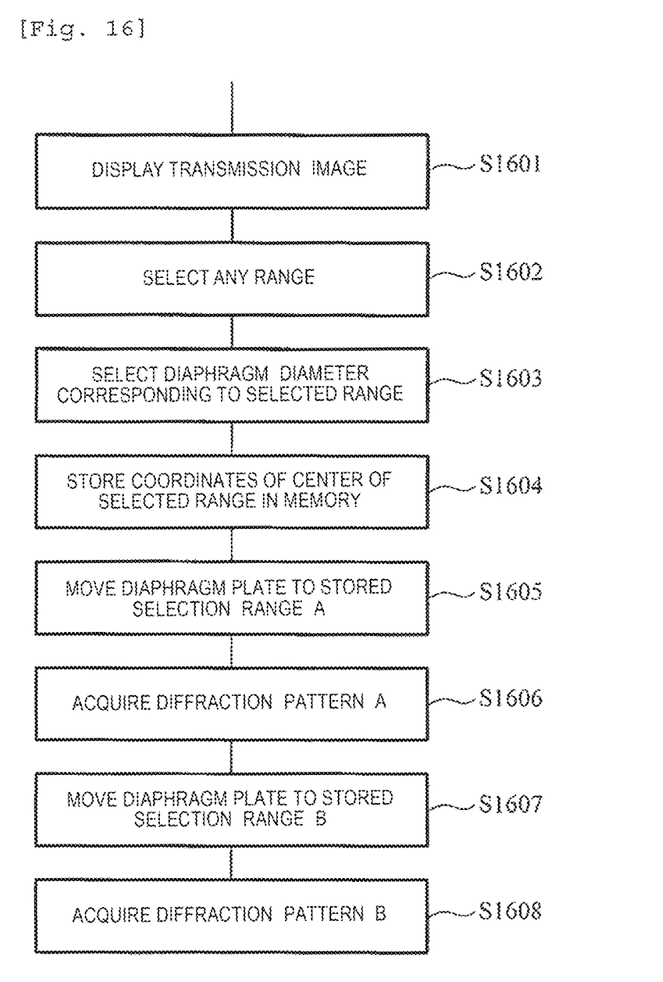
FIG. 16 is a flow chart illustrating a method of automatically acquiring the diffraction pattern corresponding to any range of the dark-field image.

Hereinafter, a method of selecting a plurality of selection ranges (partial regions) will be described. FIG. 15 is an example of a GUI displayed on a display device 123. In FIG. 15, a transmission image is displayed in the image display region 400, and a GUI screen 401 is displayed below the transmission image. Hereinafter, reference will be made to FIGS. 15 and 16 to describe a specific example of a function of automatically and consecutively imaging diffraction patterns corresponding to individual selection ranges (partial regions).

Step 1601

In a case where a diffraction pattern corresponding to any range in a transmission image to be observed is desired to be imaged, an operator switches selection in a mode selection column 402 of the GUI screen 401 to a TEM image observation mode. A main control device 121 having received the selection controls the projective lenses 110 to 113 using a current suitable for the TEM image observation mode. As a result, a TEM image is displayed in the image display region 400.

Step 1602

The operator selects any range in the TEM image displayed in the image display region 400. For example, in a case where the operator selects a selection range A, the operator inputs a check in an A column of a check box 406 displayed on the GUI screen 401, clicks a registration button 403, and further designates the observed any range A in the TEM image. The designation (selection) of the range herein is performed by clicking or dragging a pointing device.

The number of ranges to be selected is not limited to one, and may be two or more. For example, in a case where a range B is further selected, the operator inputs a check to a B column of the check box 406 displayed on the GUI screen 401, clicks the registration button 403, and further designates the any selection range B of the diffraction pattern. The operator's operation of designating the range is repeatedly executed until the registration of a range to be imaged is completed.

Step 1603

Whenever a range is designated (selected), the main control device 121 selects an aperture diameter corresponding to the size of the range. The aperture diameter as used herein means the diameter of the hole constituting the selected area aperture 107.

Step 1604

Whenever a range is designated (selected), the main control device 121 calculates coordinates of the center thereof, and stores the coordinates in a memory. In a case where the size of the range is arbitrary, the size of the range is also stored in the memory. Hereinafter, the main control device 121 transitions to an operation mode in which diffraction patterns corresponding to one or plurality of ranges stored are acquired in order. The acquisition of the diffraction patterns is started by the operator's click of a diffraction pattern button 407 using a pointing device 180.

Step 1605

The main control device 121 first automatically moves specific hole (the hole selected in step 1603) of the selected area aperture 107 to the position of coordinates of the range A. That is, the position of the selected area aperture 107 is adjusted so that the range for which the structure thereof is desired to be analyzed and the specific hole of the selected area aperture 107 conform to each other. The movement of the selected area aperture 107 is determined in accordance with a positional relationship between the selected area aperture 107 and the TEM image. Meanwhile, the center of the selected area aperture and the center of an optical axis conform to each other during correction. A coordinate system of a camera image, a coordinate system of an image formation surface (primary image surface), and a coordinate system of a diffraction surface are similar to each other in accordance with conformity between both the centers, and the coordinate systems can be handled as one coordinate system.

Step 1606

When an imaging button 405 is clicked, the main control device 121 switches a current value of the projective lens to a diffraction pattern observation mode to acquire a diffraction pattern A corresponding to a selection range A, and displays the diffraction pattern in the image display region 400 of the display device 123. The operator observes the diffraction pattern A displayed in the image display region 400. In a case where the number of diffraction spots designated is only one, the processing is terminated in the process of this step.

Step 1607

In a case where a plurality of selection ranges are registered for the imaging of a diffraction pattern in step 1601, the main control device 121 automatically executes a process of imaging a diffraction pattern with respect to the other ranges in order. Here, the specific hole (the hole selected in step 1603) of the selected area aperture 107 for the imaging of the selection range B is moved to the position of coordinates of the selection range B. At this time, the main control device 121 may switch the observation mode to a TEM image observation mode, but may maintain the diffraction pattern observation mode because the coordinates of the selection range B are already registered.

Step 1608

When the imaging button 405 is clicked, the main control device 121 switches a current value of the projective lens to a diffraction pattern observation mode to acquire a diffraction pattern B of the selection range B, and displays the acquired diffraction pattern in the image display region 400 of the display device 123. The operator observes the diffraction pattern B displayed in the image display region 400. The processes of steps 1607 and 1608 are repeatedly executed on all of the diffraction spots registered.

In this manner, in this example, a plurality of selection ranges are registered for one TEM image in advance, and thus it is possible to automatically and consecutively acquire a plurality of diffraction patterns equivalent to the respective selection ranges. That is, it is not necessary to repeat an operation of designating one range to acquire a diffraction pattern with respect to one TEM image, and the method of this example can make the acquisition and observation of a diffraction pattern more remarkably efficient than those in the method of the related art.

In addition, it is possible to analyze a crystalline structure such as crystal orientation or a coupling angle of crystal grains by using the acquired diffraction pattern. The analysis thereof can be performed at once with respect to the acquired plurality of diffraction patterns.

Meanwhile, after the plurality of diffraction patterns are confirmed, the operator can also select a specific diffraction pattern and move to the diffraction pattern. The operator cannot only easily acquire a plurality of diffraction patterns to be observed in a short period of time but also selectively observe a TEM image corresponding to any range by holding coordinates corresponding to the acquired diffraction patterns in a memory.

In addition, the coordinates of the diffraction patterns are linked with a sample stage 105, and thus it is also possible to store the diffraction pattern acquired and the coordinates thereof with respect to a sample position where the diffraction pattern is acquired.

Figure 6:
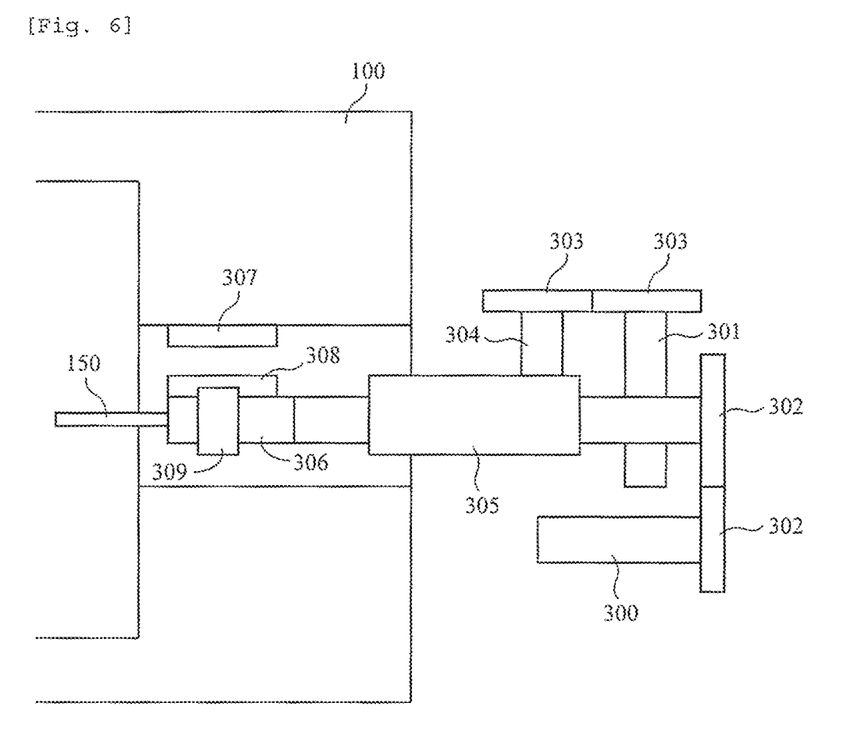
FIG. 6 is a diagram illustrating an example of a driving mechanism of the aperture plate.

Meanwhile, it is assumed that the selected area aperture 107 in this example includes the same driving mechanism as the objective aperture driving mechanism illustrated in FIG. 6. For example, a linear scale is disposed for each of the X-axis direction and the Y-axis direction to measure a real amount of movement in the vicinity of the aperture, and a measurement result is fed back to a motor control unit, whereby it is possible to increase the accuracy of movement.

In addition, regarding the driving mechanism of the selected area aperture 107, a positional relationship is previously corrected in accordance with the same procedure as that of the objective aperture driving mechanism. For example, when the number of pulses required in a case of movement between two setting ranges (it is preferable that one setting range is set in the vicinity of the center of a display screen) which are designated on the display screen is counted, it is possible to calculate the number of pulses required for each movement.

Other Examples

Meanwhile, the invention is not limited to the above-described examples, and includes various modification examples. For example, the above-described examples are described in detail in order to facilitate the understanding of the invention, and are not necessarily limited to examples including all of the configurations described. In addition, a portion of a configuration of a certain example can also be replaced with a configuration of another example, and a configuration of another example can also be added to a configuration of a certain example. In addition, the addition, deletion, or replacement of other configurations can be made to a portion of the configurations of the respective examples.

REFERENCE SIGNS LIST

100: MAIN COLUMN
101: ELECTRON GUN (CHARGED PARTICLE SOURCE)
102: CONDENSER LENS 1
103: CONDENSER LENS 2
104: CONDENSER LENS 3
105: SAMPLE STAGE
106: OBJECTIVE APERTURE
107: SELECTED AREA APERTURE
110: PROJECTIVE LENS 1
111: PROJECTIVE LENS 2
112: PROJECTIVE LENS 3
113: PROJECTIVE LENS 4
114: CCD CAMERA
120: APERTURE CONTROL SUBSTRATE
121: MAIN CONTROL DEVICE
122: ELECTRON LENS CONTROL SUBSTRATE
123: DISPLAY DEVICE
124: INPUT DEVICE
130: SUBSTANTIALLY PARALLEL ELECTRON BEAM
131: SAMPLE
132: PROJECTOR LENS 1
133: PROJECTOR LENS 2
134: OBJECTIVE LENS
150: APERTURE PLATE
180: POINTING DEVICE
201: DIFFRACTION SPOT
202: TRANSMISSION SPOT
300: X-AXIS MOTOR
301: Y-AXIS MOTOR
302: X-AXIS GEAR
303: Y-AXIS GEAR
304: X-AXIS FEED SCREW PORTION
305: Y-AXIS FEED SCREW PORTION
306: MOVABLE AXIS
307: LINEAR SCALE
308: X-AXIS SCALE
309: Y-AXIS SCALE
310: APERTURE PLATE
311: Main Column

The invention claimed is:

1. A charged particle beam device comprising:
a condenser lens which irradiates a sample with a charged particle beam;
a projective lens which forms an image of the sample based on the charged particle beam that passes through the sample;
an aperture which is disposed inside the projective lens and in which a plurality of openings, having different sizes, for transmitting an electron beam from the sample are formed;
a movement unit, including a gear and feed screws, which changes a position of the aperture;
a camera which obtains the image formed by the projective lens;
a controller storing a program which, when executed, causes the controller to automatically switch between a diffraction pattern observation mode and a TEM image observation mode, and automatically adjust the position of the aperture;
a display device which displays the image obtained by the camera;
a graphical user interface which selects a first predetermined portion of a plurality of predetermined portions from the displayed image; and
a measurement unit, including one or more linear scales, which measures a movement distance of the aperture,
wherein the controller controls the movement unit to move the aperture from a positional relationship between the aperture and the image in accordance with a position of the selected first predetermined portion, wherein the image is at least one of an electron beam diffraction image and a transmission image of the sample, wherein the aperture is at least one of an objective aperture capable of being inserted into a diffraction surface within the projective lens and a selected area aperture capable of being inserted into a primary image surface within the projective lens, wherein the graphical user interface automatically and consecutively selects each of unselected ones of the plurality of predetermined portions after the first predetermined portion, and the movement unit automatically and consecutively moves the aperture from the positional relationship between the aperture and the image in accordance with a position of each of the plurality of predetermined portions to automatically acquire all dark field images corresponding to the plurality of predetermined portions, wherein all of the dark field images corresponding to the plurality of predetermined portions are observable at once in a same screen of the display device, and wherein the movement unit changes the position of the aperture by feeding back a measurement result of the measurement unit.

2. The charged particle beam device according to claim 1, wherein the image is an electron beam diffraction image and a transmission image of the sample, and wherein the aperture is an objective aperture capable of being inserted into a diffraction surface within the projective lens and a selected area aperture capable of being inserted into a primary image surface within the projective lens.

3. A sample observation method using a charged particle beam device including a condenser lens which irradiates a sample with a charged particle beam, a projective lens which forms an image of the sample based on the charged particle beam that passes through the sample, an aperture which is disposed inside the projective lens and in which a plurality of openings, having different sizes, for transmitting an electron beam from the sample are formed, a movement unit which changes a position of the aperture, a camera which obtains the image formed by the projective lens, a controller storing a program which, when executed, causes the controller to control operation of the charged particle beam device, a display device which displays the image obtained by the camera, a graphical user interface which selects a predetermined portion from the displayed image, and a measurement unit, including one or more linear scales, which measures a movement distance of the aperture, the method comprising:

receiving selection of the predetermined portion from the image displayed on the display device through the graphical user interface; and causing the movement unit to move the aperture from a positional relationship between the aperture and the image in accordance with a position of the selected predetermined portion; and automatically switching between a diffraction pattern observation mode and a TEM image observation mode, and automatically adjusting the position of the aperture, wherein the image is at least one of an electron beam diffraction image and a transmission image of the sample, wherein the aperture is at least one of an objective aperture capable of being inserted into a diffraction surface within the projective lens and a selected area aperture capable of being inserted into a primary image surface within the projective lens, wherein the graphical user interface automatically and consecutively selects each of unselected ones of the plurality of predetermined portions after the first predetermined portion, and the movement unit automatically and consecutively moves the aperture from the positional relationship between the aperture and the image in accordance with a position of each of the plurality of predetermined portions to automatically acquire all dark field images corresponding to the plurality of predetermined portions, wherein all of the dark field images corresponding to the plurality of predetermined portions are observable at once in a same screen of the display device, and wherein the movement unit changes the position of the aperture by feeding back a measurement result of the measurement unit.

4. The sample observation method using the charged particle beam device according to claim 3, wherein the image is an electron beam diffraction image and a transmission image of the sample, and wherein the aperture is an objective aperture capable of being inserted into a diffraction surface within the projective lens and a selected area aperture capable of being inserted into a primary image surface within the projective lens.

* * * * *